United States Patent [19]

Goldin et al.

[11] 4,100,879
[45] Jul. 18, 1978

[54] DEVICE FOR EPITAXIAL GROWING OF SEMICONDUCTOR PERIODIC STRUCTURES FROM GAS PHASE

[76] Inventors: Grigory Borisovich Goldin, Pervomaiskaya ulitsa, 66, kv. 147; Valentin Petrovich Khlebnikov, Lomonosovsky prospekt, 34, kv. 93; Jury Vasilievich Jushkov, prospekt Mira, 188, kv. 60; Vadim Nikolaevich Maslov, ulitsa A. Tolstogo, 22/2, kv. 101; Oleg Evgenievich Korobov, Golikovsky pereulok, 13, kv. 6; Vladimir Petrovich Kuklev, Frunzensky val, 38, kv. 47, all of Moscow; Vladimir Grigorievich Demyanets, prospekt Mira, 9, kv. 57, Fryazino Moskovskoi oblasti; Ljudvig Alexandrovich Dolomanov, ulitsa Uritskogo, 12$^a$, kv. 10, Ljubertsy Moskovskoi oblasti; Emilia Stanislavovna Kudeyarova, Leningradskaya ulitsa, 4"b", kv. 29, Podolsk Moskovskoi oblasti; Vladimir Viktorovich Nechaev, Avtozavodskaya ulitsa 9/1, kv. 24, Moscow; Ellin Petrovich Bochkarev, Leninsky prospekt, 71/11, kv. 385, Moscow; Nikolai Georgievich Voronin, ulitsa Petrozavodskaya, 15, korpus 2, kv. 164, Moscow; Jury Anatolievich Drozdov, ulitsa Krasny Kazanets, 1, korpus 2, kv. 92, Moscow, all of U.S.S.R.

[21] Appl. No.: 766,775

[22] Filed: Feb. 8, 1977

[51] Int. Cl.$^2$ ............................................. C23C 13/08
[52] U.S. Cl. ............................... 118/49.1; 427/248 G
[58] Field of Search ................ 118/48, 49, 49.1, 49.5; 148/189, 175; 427/86, 91, 124, 248 R, 248 G, 248 J, 294

[56] References Cited

U.S. PATENT DOCUMENTS

| | | | |
|---|---|---|---|
| 2,692,574 | 10/1954 | Anderson | 118/49 |
| 3,023,727 | 3/1962 | Theodoseau et al. | 118/49 X |
| 3,424,628 | 1/1969 | Winings | 118/49 X |
| 3,633,537 | 1/1972 | Howe | 118/48 |
| 3,696,779 | 10/1972 | Murai et al. | 118/48 |
| 3,783,822 | 1/1974 | Wollam | 118/49.1 |

Primary Examiner—Louis K. Rimrodt

[57] ABSTRACT

A device in which a reaction vessel is filled with a gas, and in which first and second equal and coaxial disks are located. They have parallel operational surfaces carrying respectively, at least one substrate and at least two sources of different semiconductor substances forming the semiconductor periodic structure. A substrate heater and a source heater are placed near the first and second disks, respectively. First and second electric motors are arranged outside the reaction vessel in order to rotate, respectively, the first and second disks about the vessel vertical axis, as well as a drive to shift one of the disks along the axis.

16 Claims, 18 Drawing Figures

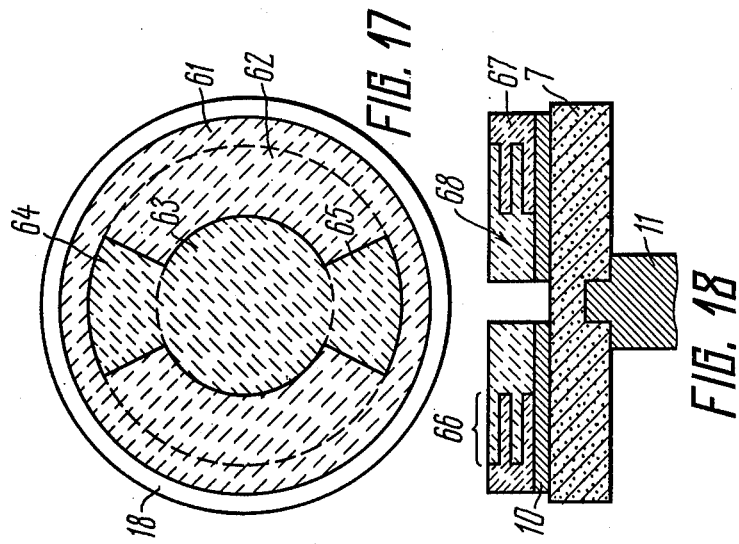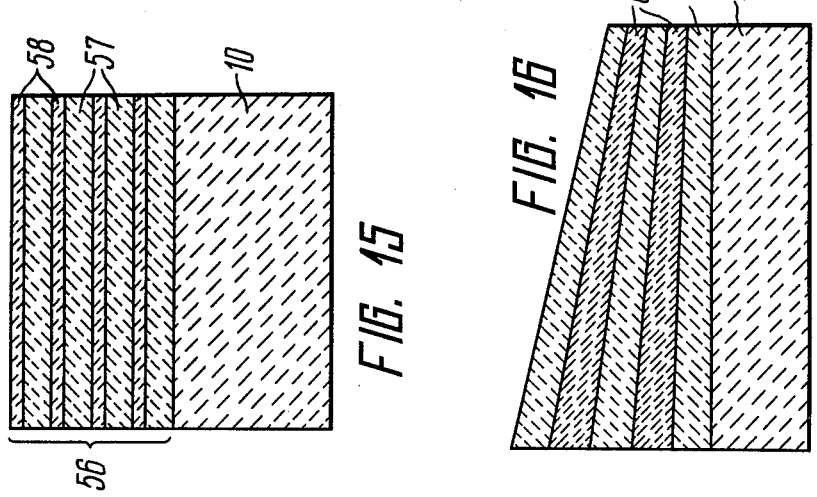

DEVICE FOR EPITAXIAL GROWING OF SEMICONDUCTOR PERIODIC STRUCTURES FROM GAS PHASE

BACKGROUND OF THE INVENTION

This invention relates to the production of semiconductor materials and structures based thereon and, in particular to a device for epitaxial growing of semiconductor periodic structures from a gas phase.

There are already known in the art devices whose principle of operation is based on epitaxial growing of periodic structures from a vapor phase by quick periodic changes of the concentration of the variable component in the gas flow supplied from the sources of substances towards the substrate.

The known device for epitaxial growing of semiconductor periodic structures from a vapor phase comprises: a vertical tubular reaction vessel filled with gas and provided with an inlet and outlet for said gas containing agents for carrying out the chemical reaction, a first disk located in the vessel and provided with an external surface and an operational surface carrying a substrate, which is mechanically connected to an electric motor for rotation of the first disk, the motor being located outside the vessel and ensuring rotation of the first disk about the vertical axis of the vessel, sources of the substances making up the layers of the semiconductor periodic structure being grown, a mechanism ensuring a specified sequence of the substance transfer from the sources to the substrate, and heaters for the sources and for the substrate, which produce the required temperature difference between the latter.

The mechanism ensuring the specified sequence of the transfer of substances from the sources to the substrate is an injection system placed outside the reaction vessel and provided with a three-way solenoid valve switched by means of an electron time relay.

The injection system of the known device is designed for quick feed of the vapor phase components, their ratio being determined by the position of the three-way solenoid valve regulating the supply of the substances from the sources outside the reaction vessel.

The above mentioned electron time relay of the injection system is intended for control of the switching periods of the solenoid valve and the duration of the injection cycle for supplying the vessel with the gas mixture of each composition corresponding to the composition of the alternating layers in the periodic structure being grown.

It is possible, with the help of the electronic control setting the duration of the injection cycle to regulate not only the thickness of the layers in the periodic structure but also the ratio of the concentrations of the variable component in the alternating layers of the periodic structure.

The known device is characterized by a very small volume of the vessel (about 100 cm³), which is due to the required quick change of the vapor phase, when switching from growing of a layer of one composition to growing of a layer of another composition.

Another characteristic of the known device is the fact that a part of the sources (those producing highly volatile components of the periodic structure) is located outside the vessel.

The source producing a less volatile component is located inside the vessel and its temperature is maintained by a heater placed outside the vessel. The substrate heater is also placed outside the vessel.

The known device is employed for epitaxial growing of a "superlattice" periodic structure based upon $GaAs_{1-x}P_x$ solid solutions with variable $x$ values (where $x$ is the mole fraction of gallium phosphide in the solid solution).

The sources of arsenic and phosphorus in the known device are bottles containing $PH_3$ phosphine and $AsH_3$ arsine mixed with hydrogen. The arsine flow is constant, whereas the phosphine flow is periodically cut off by means of the three-way solenoid valve.

The source of gallium is metallic gallium placed in a container located in the upper part of the vessel.

In order to effect the chemical reaction of transferring gallium from the source to the substrate, the gas mixture ($H_2$ + $HCl$) is fed into the vessel, hydrogen chloride $HCl$ being the chemical agent for the chemical reaction.

The temperature of the gallium source is 900° C and the temperature of the substrate is 760° C.

If the volume of the injection system, supply pipes and the tubular vessel itself is sufficiently small (about 100 cm³) and the flow rate of the gas mixture through the vessel is sufficiently high (about 1,000 cm³/min), the known device permits quick periodic change of the vapor composition in the vessel space and respective alternation of X values from one layer to another during the epitaxial growing of the $GaAs_{1-x}P_x$ solid solution.

The above described known device has been used in order to grow periodic semiconductor structures with a period within the range of from 225 Å to 1,000 Å and the amplitude of the periodic X variation (gallium phosphide content) from 0.1 to 0.4 mole fractions.

Layers 110 Å thick were grown during 2 second long injection cycles at a velocity of the epitaxial growth of 40 microns/hour, the thickness deviations from its mean value throughout the deposited periodic structure being less than 1%.

The same known device was used to produce a structure based on $Cd_xHg_{1-x}Te$.

Thus, the above described known device can be employed for producing semiconductor periodic structures based on solid solutions of a different nature, though in any case the use of gaseous substances as sources of semiconductor components is compulsory.

However, despite the fact that the known device can be used to obtain a structure possessing required properties and advantages, this technical design known in the art is not devoid of some disadvantages inherent in its constructional peculiarities. The main disadvantage of the known device is the fact that the solenoid valve cannot measure and feed gaseous components in batches less than the amount of the component in the 110 Å thick epitaxial layer. The process of batching becomes impossible, when the volume of the gas passing during one cycle becomes comparable to the effective internal volume of the valve itself, which happens when the injection cycle becomes shorter than 2 seconds. In this case the amplitude of the phosphorus periodic variations within the vessel space and in the growing periodic structure becomes uncontrollable and this seriously complicates growing of periodic structures with a period less than 200 Å and less than 100 Å thick layers, that is qualitatively new "superlattice" periodic structures, where new quantum dimensional effects can appear.

The next serious disadvantage is the low efficiency of the known device owing to the reduction of the vessel volume in order to facilitate periodic changes of the gas phase in the vessel in the shortest time possible during the growth of "superlattice" periodic structures with a period of 200 Å and less. That is why only one normal substrate can be loaded into the vessel of the known device with a diameter of 15 mm and, respectively, the process of epitaxial growing of only one periodic structure can be carried out.

Owing to its low output capacity, the known device is unsuitable for industrial production of semiconductor periodic structures on a large scale.

Another important disadvantage of the known device is the restriction of the range of substances producing the components for the periodic structures being grown by the fact that only highly volatile substances and compounds can be used for batching.

These substances and compounds should be synthesized in advance, be pure enough for "the use in electronics" and should not interact with both the material of the solenoid valve and the material of the pipes connecting the sources of highly volatile substances to the solenoid valve and the vessel. This disadvantage restricts appreciably the scope of semiconductor structures which can be used as the base for production of periodic structures.

One more disadvantage of the known device is the fact that it is impossible to control separately the content of the basic components constituting the semiconductor solid solution in the gas phase and the content of doping impurities. This disadvantage does not permit control of the distribution of the doping impurities in the semiconductor structure being grown irrespective of the distribution of the basic components of the solid solution. As a result, the known device permits production of only the most simple periodic structures and can not be used to produce complex structures in which, for example, heterojunctions are combined with p-n junctions or $n-n^+$ junctions.

It is also a disadvantage of the known device that it permits changing of the gas phase composition only over the entire surface of the substrate and cannot provide control of the main parameters of the periodic structure (amplitude and period of composition change) at definite separate parts of the substrate. The known device, for example, cannot be used to grow periodic structures, wherein the period is changed according to a certain principle from one edge of the substrate to the other.

This disadvantage is accounted for by the fact that the gas phase is changed in the entire volume of the vessel during the process of growing.

Finally, one more disadvantage of the known device is the fact that it permits no fine adjustments in the composition of the periodic structure while switching from one layer to another layer and, consequently, no concentrated profile of a specified shape can be formed. This disadvantage is due to the fact that the process of formation of the concentrated profile, controlled by the solenoid valve switching is superimposed by processes of mixing of gaseous components in the valve itself, in the connecting pipes and in the vessel space. These processes are difficult to control.

SUMMARY OF THE INVENTION

It is an therefore, object of the present invention to provide a device ensuring epitaxial growing of qualitatively new semiconductor periodic structures featuring less than 100 Å thick layers.

It is also an object of this invention to provide a device of high capacity and, consequently, suitable for large scale industrial production of semiconductor periodic structures.

Another object of this invention is to provide a device without any restrictions to semiconductor materials producing the components of the periodic structures being grown.

Besides, another object of this invention is to provide a device whose design permits separate control of both the content of the basic components constituting the structure being grown in the gas phase and of the content of doping impurities, which is in some instances is imperative for production of complex structures.

Yet another object of this invention is to provide a device ensuring formation of a specific concentration profile of the semiconductor structure components distribution in the periodic structure being grown, while switching from one layer to another.

Still another object of the invention is to provide a device ensuring both the uniform supply of semiconductor substances onto the entire surface of the substrate and the supply of components to specific, predetermined portions of this surface, as well as specified variation of the feed velocity of components along a definite direction on the substrate surface.

And, finally, a further object of this invention is to provide a device ensuring formation of a structure possessing a modulated amplitude of the layer-to-layer composition variation, which contributes to compensation of diffusion processes in the ready structure and, in particular, in "superlattice" structures with a period of about 100 Å.

These and other objects of this invention are achieved by a device for epitaxial growing of semiconductor periodic structures from a gas phase, comprising a vertical tubular vessel filled with a gas and provided with an inlet and an outlet containing agents for carrying out the chemical reaction, a first disk housed in the vessel, provided with an external surface and an operational surface to carry a substrate and mechanically connected to an electric motor for rotation of said first disk, which is located outside the vessel and ensures rotation of the first disk about the vertical axis of the vessel, sources of substances making up the layers of the semiconductor periodic structure being grown, a mechanism ensuring a specific sequence of feeding the substances from the sources to the substrate and heaters of the sources and the substrate, which produce the temperature difference between the latter. According to the invention, the device is equipped with a second disk equal in diameter to the first disk and placed inside the vessel near said first disk and coaxial therewith, having an external surface and an operational surface parallel to the operational surface of the first disk, whereon at least two sources made of different semiconductor materials are mounted next to one another and alternating in the direction of the second disk rotation. At least one substrate is placed on the operational surface near the periphery of the first disk; the device also has an electric motor for rotation of the second disk, located outside the vessel and mechanically connected to the second disk, ensuring its rotation about the vertical axis of the vessel and forming, in combination with the first electric motor, the mechanism ensuring the specific sequence of feeding substances from the sources to the substrate, and a drive for shifting a disk along the axis of the vessel, mechanically connected to one of the disks. The substrate heater is secured in the vessel near the external surface of the first disk, the source heater being secured in the vessel near the external surface of the second disk. Both heaters have a flat heating front ensuring a temperature field with flat isothermal surfaces parallel to the operational surfaces of the disks. At least one of the sources is made of a first semiconductor material which composition corresponds to the composition of the first group of layers of the periodic semiconductor structure being grown. At least one of the sources is made of a second semiconductor material which composition corresponds to the composition of layers alternating with the layers of the first group of layers of the structure, whereas the disks are placed with a clearance between the surfaces of the substrate and the source within a spacing from 20 microns to 5 millimeters.

It is advisable that each heater be made as a current conductive coil heated by electric current and protected by a sheath made of a material inert with respect to the gas medium inside the vessel.

It is also advisable that the mechanical connection of the first disk to the electric motor for rotation of said first disk be effected by means of a first rod, of which one end is rigidly secured in the center of the external surface of the first disk perpendicular to its operational surface, this first rod should project from the vessel and tightened by adjusting screws outside the vessel, the other end of the first rod being kinematically connected to the electric motor for rotating the first disk. The mechanical connection of the second disk to the electric motor for rotation of the second disk is made by means of a second rod, of which one end is rigidly secured in the center of the external surface of the second disk perpendicular to its operational surface. It is useful that the second rod comes out of the vessel and is tightened by adjusting screws. The other end of the second rod is kinematically connected to the electric motor for rotation of the second disk. The drive for shifting the disk along the axis of the vessel is kinematically connected to the second end of the first rod.

It is also useful that the device be additionally equipped with a drive for shifting a disk along the axis of the vessel, which is kinematically connected to the second end of the second rod.

It is also useful that the first disk be provided with a central opening and the mechanical connection of the first disk to the electric motor for its rotation be effected by means of a hollow shaft, of which one end is rigidly secured in the central opening of the first disk perpendicular to its operational surface and the second end is kinematically connected outside the vessel to the electric motor for rotation of the first disk; it is advisable that the mechanical connection of the second disk to the electric motor for rotation be effected by means of a stem whose diameter is less than the inside diameter of the hollow shaft. The first end of the stem is secured to the center of the operational surface of the second disk, the stem is placed inside the hollow shaft and centered so that the shaft and the stem are able to rotate with respect to each other. The stem projects from the second end of the hollow shaft through a sealing member. The second end of the stem is kinematically connected to the electric motor for rotation of the second disk and to the drive for shifting the disk along the vessel axis.

It is also advisable that the first end of the stem be rigidly secured in the center of the operational surface of the second disk.

It is also advisable that the first and second disks be provided with openings passing through the central zone near the place the rods are secured, with their axes are parallel to the axis of the vessel.

It is also useful that the first and second disks be provided with openings in the central zone near the places where the hollow shaft and the stem are respectively secured, axes parallel to the with their axis of the vessel. The openings intended for feeding the gas flow to the central zone of the clearance between the disks in the process of their rotation.

Besides, it is advisable that depressions be made in the second disk on its operational surface along the periphery of said second disk, adjacent to one another and intended for location of sources. The surface of the source placed in a respective depression is made lower than the operational surface of the disk by a distance selected from the interval from 20 micron to 5 mm.

It is also advisable that depressions be made in the first disk on its operational surface, arranged along the periphery of the first disk, adjacent to one another and intended for location of substrates. The surface of the substrate placed in a respective depression is made lower than the operational surface of the disk by an amount between 50 and 500 microns.

It is useful that the depressions in the first disk be made of such a shape that their projection onto the second disk lies within the limits of the depressions of the second disk.

It is also useful that the first and second disks be brought into contact by their operational surfaces and in doing so the stem be connected by a hinge to the center of the operational surface of the second disk.

It is useful that the location of each source be bounded by a rim made on the second disk, whose height above the surface of the source is between 0.5 and 5 mm.

It is also advisable that the plane of the source surface be placed at an angle of less than 10° with the plane of the substrate surface.

It is also useful that at least one source be provided with a mask covering the surface of the latter and featuring windows whose number, dimensions and arrangement on the surface of the source is determined by the required velocity of transferring the substance from different portions of the source to the substrate.

And, finally, it is advisable that at least one source be made with a variable composition characterized by a gradient directed perpendicular to the surface of the source.

The main advantage of the disclosed device consists in the possibility of accurate control within a very wide range of the amount of substances transferred onto the substrate in a definite sequence from different sources. The disclosed device permits accurate dose measuring of alternating components during deposition on the substrate, even feeding in portions corresponding to a substance mass not more than 10 monoatomic layers of the growing crystal. That is why the thickness of layers in the periodic structure can be varied within the range of 50 Å to 10,000 Å.

Another advantage of the device in accordance with the present invention is the fact that the accuracy and the lower limit of dose measuring (metering) of alternating substances fed to the substrate from different sources do not depend upon the vessel volume and the number of substrates located simultaneously in the vessel.

Thus, the disclosed device can ensure high capacity of the technological process without deteriorating the parameters of the periodic structures produced in this way. That is why the disclosed device can be used not only in laboratory conditions but for industrial production of various periodic structures.

An important advantage of the device is the fact that solid monolith and powder semiconductor substances can be used as sources, which expands the scope of semiconductor materials usable as the base for periodic structure production.

Another important advantage of the disclosed device is the fact that alternating supply of different substances to the substrate from a great number of sources can be simultaneously and separately controlled. In this case various components can be alternated in conformity with various principles. As a result it becomes possible to grow epitaxially complex periodic structures, wherein, for example, both the doping impurities which determine the type of conduction and concentration of charge carriers and the basic components of the semiconductor solid solution changing the width of the forbidden zone can be simultaneously alternated according to various principles.

Another important peculiarity of the disclosed device is the fact that the velocity of supplying alternating substances to the substrate can be varied in time according to a definite principle and with a high accuracy. In this way the disclosed device permits production of a specific concentration profile of the layer-to-layer distribution of the periodic structure components.

One more substantial advantage of the disclosed device is the fact that semiconductor substances can be fed from different sources both uniformly to the entire surface of the substrate and only on certain, predetermined portions of the substrate surface. It is also possible to change the velocity of substance feeding along a definite direction on the substrate surface. This permits growth of periodic structures, wherein the thickness of layers and the period of the structure is variable in a specified direction on the surface of the substrate.

One more advantage of the disclosed device is the fact that the amplitude of composition variations during supplying of alternating substance flows from different sources to the substrate can be gradually changed in accordance with a specific principle. This results in the appropriate modulation of the amplitude of the composition variations in the growing periodic structure.

As a result it becomes possible to ensure such gradual change in the amplitude of the periodic structure composition, so as to completely compensate the diffusion processes in the solid phase, resulting in spreading of small-period periodic structures, e.g. "superlattice" structures with a period of about 100 Å.

The invention will now be described in greater detail with reference to specific embodiments thereof, taken in conjunction with the accompanying drawings.

BRIEF DESCRIPTION OF THE DRAWING

FIG. 15 shows a section view of a schematic diagram of a semiconductor periodic structure grown on the substrate epitaxially by means of the disclosed device, according to the invention;

FIG. 16 shows a section view of a schematic diagram of another semiconductor periodic structure epitaxially grown on the substrate by means of the disclosed device, according to the invention;

FIG. 17 shows a top view of a disk provided with other sources for epitaxial growing of semiconductor periodic structures from a gas phase, according to the invention;

FIG. 18 shows a section view of a schematic diagram of a third semiconductor periodic structure grown on a substrate epitaxially by means of the device and located on the first disk, according to the invention.

DESCRIPTION OF THE PREFERRED EMBODIMENTS

Figure 1:
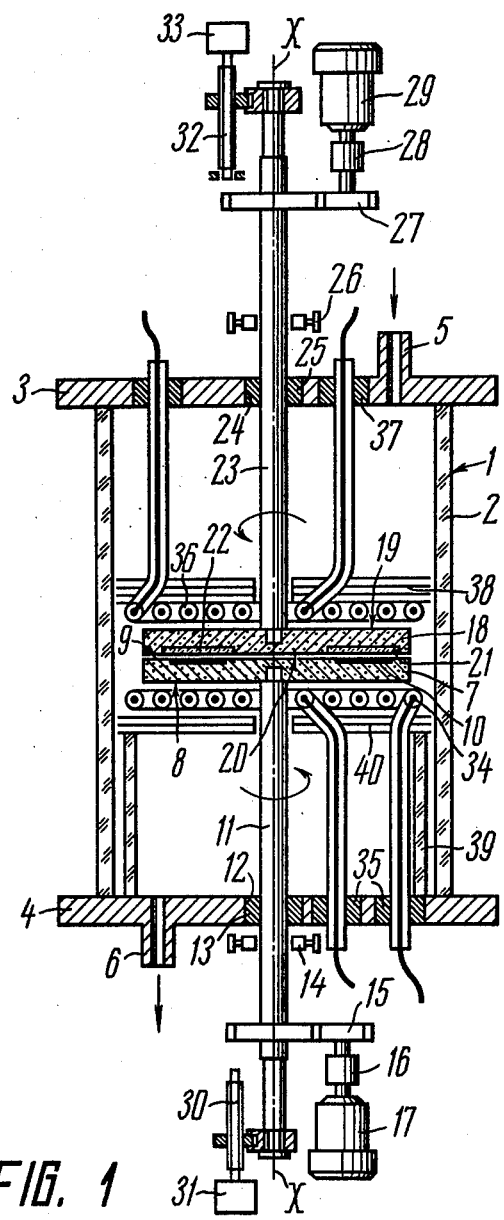
FIG. 1 shows a general view of a first embodiment of a device for epitaxial growing of semiconductor periodic structures from a gas phase, taken along the axis of a vertical tubular reaction vessel, according to the invention.

A device for epitaxial growing of semiconductor periodic structures from a gas phase, comprises a vertical tubular reaction vessel 1 (FIG. 1) filled with gas.

The reaction vessel 1 is composed of a cylindrical quartz tube 2 provided with water-cooled flanges 3 and 4 at its butts, which seal the vessel 1 tightly. The flange 3 is equipped with an inlet connection 5 to let the gas into the vessel 1, whereas the flange 4 is equipped with a connection 6 to let the gas out of the vessel 1.

The flow of gas passing through the vessel 1 contains a chemical agent for carrying out the chemical reaction.

A disk 7 is located inside the vessel 1, having an external surface 8 and an operational surface 9.

Substrates 10 are placed on the operational surface 9 inside the periphery of the disk 7.

A rod 11 is secured in the center of the external surface 8 of the disk 7 perpendicular to the operational surface 9. The rod 11 comes out of the vessel 1 through an opening 12 provided with a pressure seal 13.

Outside the vessel 1 the rod 11 is fastened by adjustment screws 14. The end of the rod 11 is mechanically connected via a spur gear drive 15 and a reducer 16 to the outlet shaft of an electric motor 17 intended for rotating the disk 7.

Besides, a disk 18 whose diameter is equal to that of the disk 7 is placed inside the vessel 1 coaxial with disk 7 and in the vicinity of said disk 7.

The disk 18 has an external surface 19 and an operational surface 20.

At least two sources 21 and 22 made of different semiconductor materials are arranged on the operational surface 20 facing the operational surface 9 of the disk 7 and parallel thereto, near the periphery of said surface 20.

A rod 23 is secured in the center of the external surface 19 of the disk 18 and perpendicular to its operational surface 20. This rod 23 comes out of the vessel 1 through an opening 24 provided with a pressure sealing 25.

Outside the vessel 1 the rod 23 is fastened by adjustment screws 26.

The end of the rod 23 is mechanically connected via a spur gear drive 27 and a reducer 28 to the outlet shaft of an electric motor 29 intended for rotating the disk 18.

The second end of the rod 11 is also mechanically connected by means of a guide screw 30 to a drive 31 for shifting the disk 7 along the axis X of the vessel 1. The drive 31 may be manual.

The second end of the rod 23 is mechanically connected by means of a guide screw 32 to a drive 33 for shifting the disk 18 along the axis X of the vessel 1. The drive 33 may also be manual.

However, just one drive 31 or 33 is sufficient for the operation of the device, though the use of two drives 31 and 33 makes adjustment of mutual fitting of the disks 7 and 18, as well as their arrangement with respect to appropriate heaters much easier.

The device comprises a heater 34 of the substrate, whose outputs come out of the vessel 1 through insulated openings 35 in the flange 4 to a supply source (not shown in the drawings), as well as a source heater 36, whose outputs come through insulated openings 37 in the flange 3.

Both heaters 34 and 36 have a flat heating front and ensure a temperature field with flat isothermal surfaces parallel to the operational surfaces 9 and 20 of the disks 7 and 18, respectively.

A heat shield 38 is secured between the source heater 36 and the flange 3, which serves to reduce thermal losses on the way from the heater 36 to the flange 3. Another heat shield 40 intended to reduce thermal losses on the way from the heater 34 to the flange 4 is placed between the substrate heater 34 and the flange 4 on a base cylinder 39.

The shields 38 and 40 can be made of such materials as graphite or molybdenum and titanium sheets.

The disks 7 and 18 are arranged with respect to each other in such a way as to make the clearance between the surfaces of the substrate 10 and the source 22 placed thereon be within the range from 50 microns to 5 mm.

The source 21 located on the operational surface 20 of the disk 18 is made of the first semiconductor material which composition corresponds to the composition of the first group of layers of the periodic semiconductor structure being grown.

The other source 22 is made of a second semiconductor material which composition corresponds to the composition of the layers alternating with the layers of the first group of layers of the structure.

Figure 2:
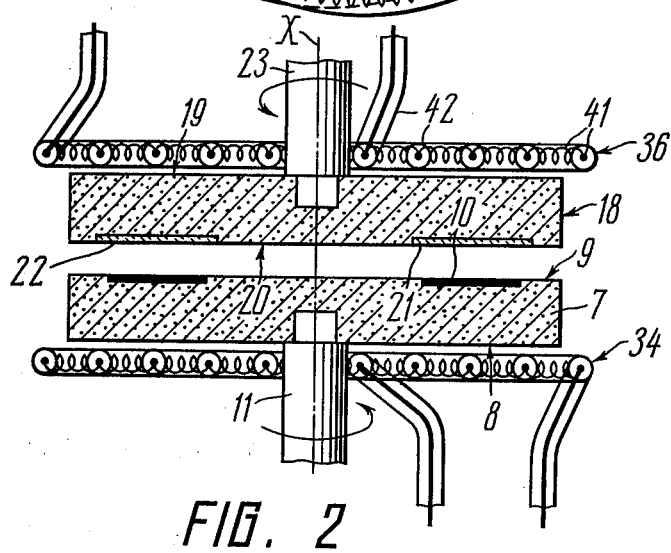
FIG. 2 shows a section view taken along the axis of the tubular reaction vessel of disks with heaters of a source and a substrate, according to the invention.

Each heater 34 and 36 comprises conductive coil 41 (FIG. 2) heated by electric current and protected by a sheath 42 made of a material inert with respect to the gas medium inside the vessel 1 (FIG. 1).

Figure 3:
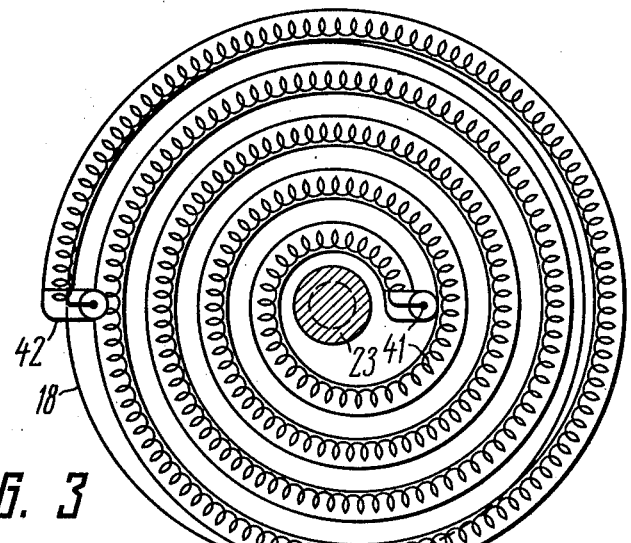
FIG. 3 shows a top view of FIG. 2, according to the invention.

The conductive coil 41 and the sheath 42, as shown in FIG. 3, form a spiral heater with a flat heating front, the sheath 42 in this case being made of quartz.

Figure 4:
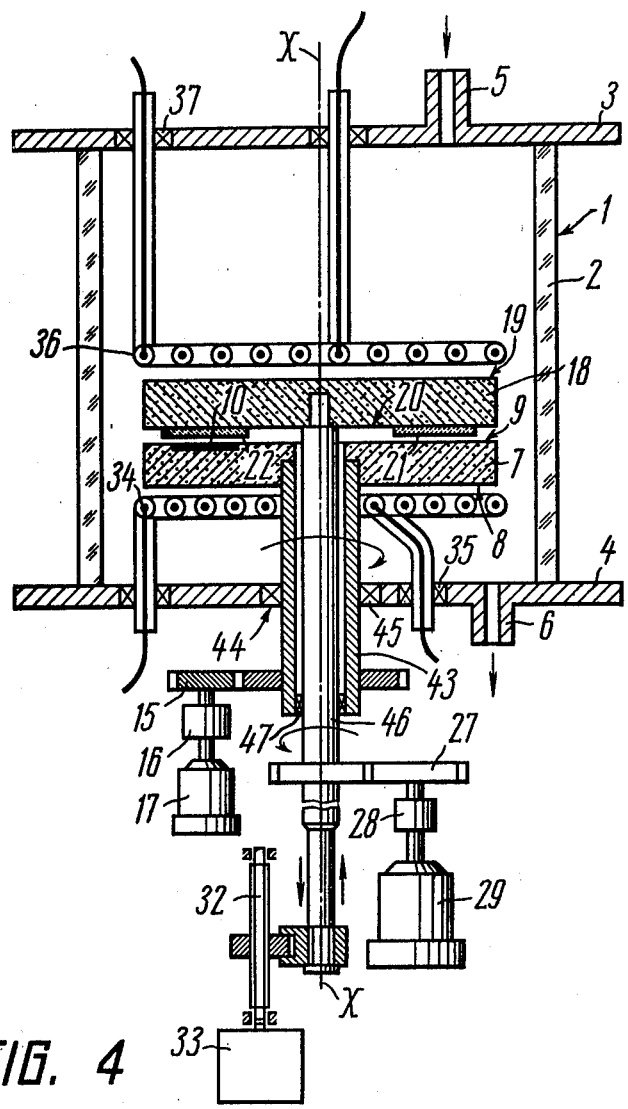
FIG. 4 shows a section taken along the axis of the vertical tubular reaction vessel of a general view of another embodiment of a device for epitaxial growing of semiconductor periodic structures from a gas phase, according to the invention.

Referring to FIG. 4, another embodiment of a device for epitaxial growing of semiconductor periodic structures from a gas phase comprises the disk 7 provided with a central opening, wherein the first end of a hollow shaft 43 is secured rigidly and perpendicular to the operational surface of the surface of the disk 7.

The hollow shaft 43 comes out of the vessel 1 through an opening 44 provided with a pressure sealing 45.

Outside the vessel 1 the end of the hollow shaft 43 is mechanically connected by means of the spur gear 15 and the reducer 16 to the outlet shaft of the electric motor 17 intended for rotating the disk 7.

A stem 46 whose diameter is less than the inner diameter of the hollow shaft 43 is secured in the center of the operational surface 20 of the disk 18 and perpendicular to its surface.

The stem 46 rigidly secured by one end in the center of the operational surface 20 is placed inside the hollow shaft 43, centered therein so that the shaft 43 and the stem 46 are able to rotate with respect to each other and comes out of the second end of the hollow shaft 43 through a pressure sealing member 47.

The second end of the stem 46 is mechanically connected to the output shaft of the electric motor 29 intended for rotating the disk 18 via the spur gear 27 and the reducer 28.

This end of the stem 46 is mechanically connected by means of the guide screw 32 to the guide 33 in order to shift the disk 18 along the axis X of the vessel 1.

The disks 7 and 18 of the device of FIG. 1 for epitaxial growing of semiconductor periodic structures from a gas phase are rigidly secured on the rods 11 and 23, respectively, and are provided in the central zone, where these rods 11 and 23 (FIG. 5) are attached, with through openings 48.

The axis of each opening 48 intended for supplying the gas flow to the central zone of the clearance between the disks 7 and 18 in the process of their rotation is parallel to the axis X of the vessel 1 (FIG. 1).

The number of the openings 48 (FIG. 5) in each disk 7 and 18 is at least two. These openings 48 are arranged in the disks 7 and 18 symmetrically with respect to the X axis of the vessel 1 (FIG. 1).

Figure 6:
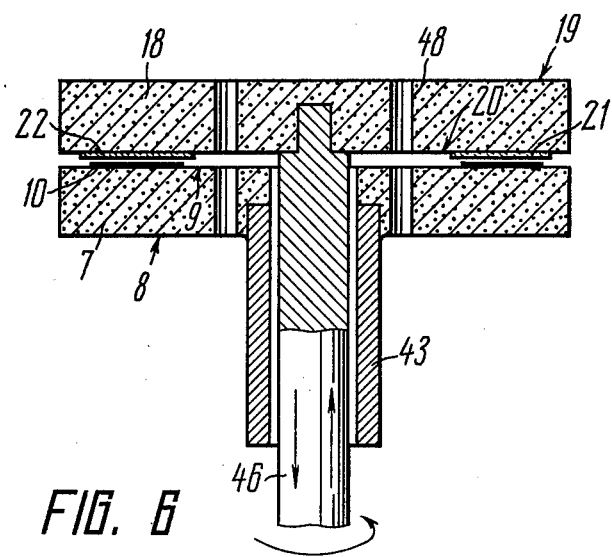
FIG. 6 shows a section taken along the axis of the reaction vessel of another embodiment of disks of the device of FIG. 4 for epitaxial growing of semiconductor periodic structures from a gas phase, according to the invention.

The disks 7 and 18 of the device of FIG. 4 for epitaxial growing of semiconductor periodic structures from a gas phase are shown in FIG. 6.

The disks 7 and 18 of this embodiment of the device are also provided with the through openings 48 located in the central zone of the disk 7, where the hollow shaft 43 is secured, and in the central zone of the disk 18, where the stem 46 is secured, and designed to supply the gas flow to the central zone of the clearance between the disks 7 and 18 in the process of their rotation.

The axes of the openings 48 are parallel to the X axis of the vessel 1 (FIG. 1).

Figure 7:
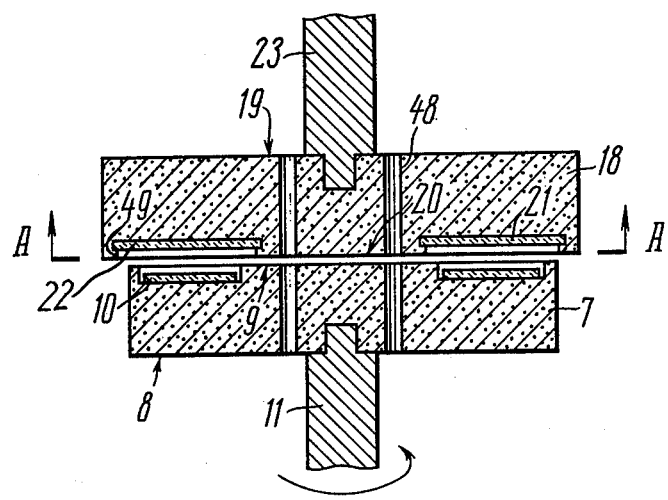
FIG. 7 shows a section taken along the axis of the reaction vessel of a third embodiment of disks of the device for epitaxial growing of semiconductor periodic structures from a gas phase, according to the invention.

One more embodiment of the disks 7 and 18 is shown in FIG. 7. Here depressions adjoining one another are made on the operational surface 20 of the disk 18 along its periphery in order to accommodate the sources 21 and 22. Rims 49 are provided on the edges of the depression in order to hold the sources 21 and 22 in respective depressions at a specific depth with respect to the operational surface 20 of the disk 18.

The surface of the source 21 or 22 located in the depression is lower than the operational surface 20 of the disk 18 by an amount from 50 microns to 5 millimeters.

The sources 21 and 22 can have any configuration.

Figure 8:
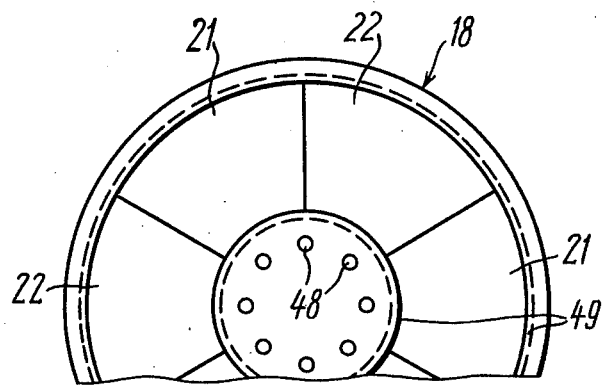
FIG. 8 shows a section taken along the arrows A, in FIG. 7 according to the invention.

Referring to FIG. 8, the sources 21 and 22 have the configuration of truncated sectors limited in their narrow part by a circular arc whose center coincides with the center of the disk 18.

These sectors adjoin each other, the sources 21 made of the first semiconductor material alternate with the sources 22 made of the second semiconductor material.

Depressions are also made on the operational surface 9 (FIG. 7) of the disk 7, which are arranged along the periphery of the disk 7 adjoining one another.

These depressions are intended to hold the substrates 10. The size of each depression is such that the surface of the substrate 10 placed therein is lower than the operational surface 9 of the disk 7 by an amount from 50 to 500 microns.

Referring to FIG. 7, the depressions for the substrates 10 are located under the respective depression of the sources 21 an 22, the shape of the latter being such that their projection onto the disk 18 is within the depressions for the sources 21 and 22.

Figure 9:
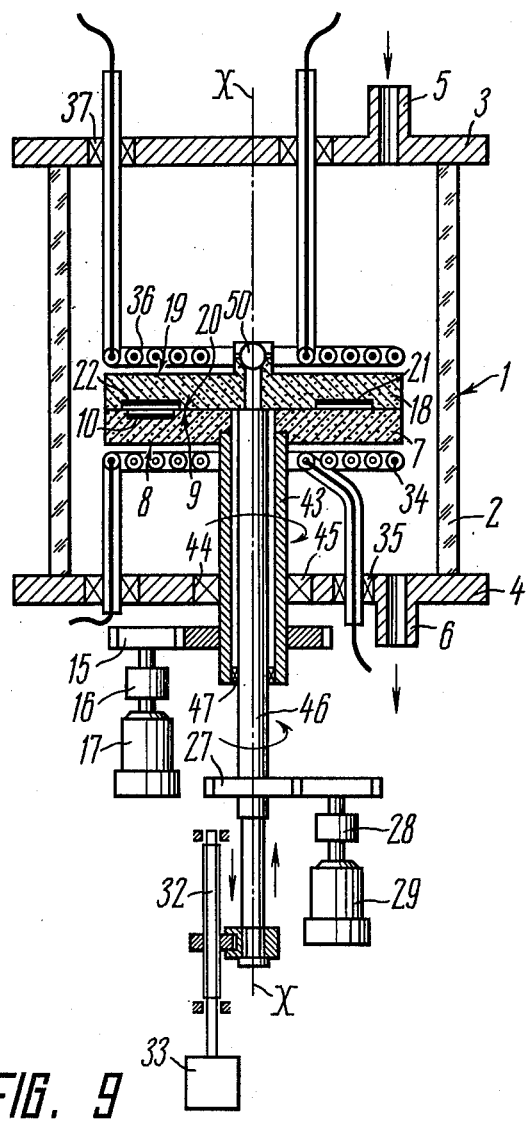
FIG. 9 shows a reaction taken along the axis of the vertical tubular reaction vessel of a general view of still another embodiment of a device for epitaxial growing of semiconductor periodic structures from a gas phase, according to the invention.

A third embodiment of the device, where the disks 7 and 18 are in contact with the operational surfaces 9 and 20, is shown in FIG. 9.

In this case the depressions for the sources 20 and 21 overlap the depressions for the substrates 10, as indicated in FIG. 7.

In all other respects the device of FIG. 9 is made exactly as it has been described in FIG. 4. But the stem 46 (FIG. 9) connected to the center of the operational surface 20 of the disk 18 is secured in the center of the disk 18 by means of a hinge 50.

In this embodiment both the sources 21 and 22 and the substrates 10 are made as solid plates in the form of truncated sectors limited in their narrow parts by a circular arc whose center coincides with the centers of the disks 7 and 18.

The sources 21 and 22, the substrates 10 and respective depressions may be disk-shaped.

Figure 10:
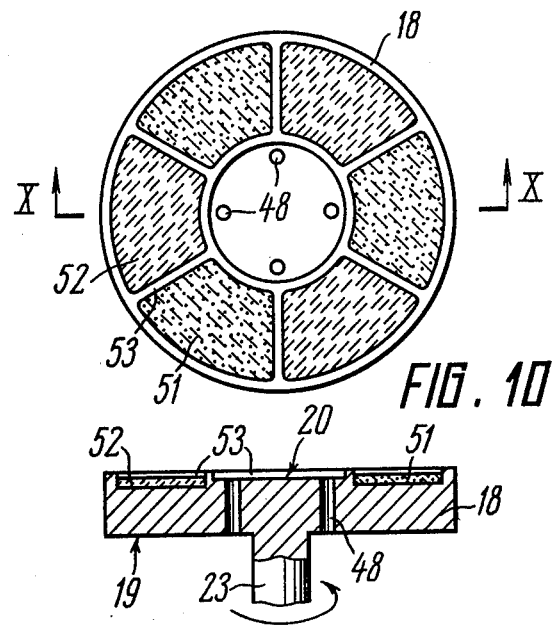
FIG. 10 shows a top view of an embodiment of a disk provided with sources restricted by rims, according to the invention.

One more embodiment of the disk 18 intended for holding sources 51 and 52 is shown in FIG. 10. The sources 51 are powders of a first semiconductor material, whereas the sources 52 alternating therewith are made as solid plates of a second semiconductor material in the form of truncated sectors, the place of location of each source 51 and 52 is bounded by a rim 53 whose height above the surface of the source is from 0.5 to 5 mm.

Figure 11:
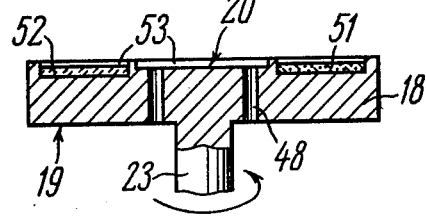
FIG. 11 shows a section taken along line X—X in FIG. 10.

Referring to FIG. 11, it is a section of FIG. 10 taken along line X—X, wherein the rims 53 hold the sources 51 and 52, the disk 18 (FIG. 1) in this case should be lower than the disk 7.

The plane of the surface of the sources 21 and 22 (FIG. 12) can be tilted with respect to the surface plane of the substrate 10.

For this purpose depressions for the substrates 10 are made in the disk 7, whose plane is tilted at an angle $\alpha$ with the operational surface 9 of the disk 7.

Since the surface of the sources 21 and 22 is parallel to the operational surface 9 of the disk 7, the surface of each substrate is inclined with respect to the surface of a respective source by an angle which can be selected from the range of 0° to 10°.

Figure 13:
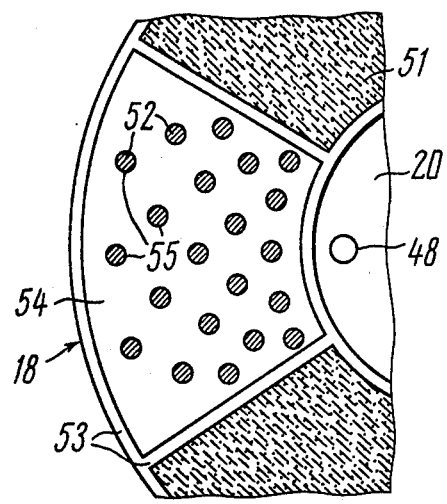
FIG. 13 shows a top view of a part of a disk with a contact mask, according to the invention.

A part of the disk 18 of FIG. 10 is shown in FIG. 13. In this case the source 52 is provided with a contact mask 54 featuring windows 55. The density of round windows 55 changes in the radial direction from the maximum near the center of the disk 18 to the minimum near the periphery of the disk 18.

However, the principle of density variation of the windows 55, their shape and dimensions can be selected in conformity with the required velocity of the semiconductor substance transfer from different portions of the source 52, but within such limits as to keep the maximum size of the windows 55 in the contact mask 54 and the distance between the edges of the adjacent windows 55 much smaller (one-third to one-sixteenth) than the clearance between the surfaces of the substrate 10 (FIG. 4) and the source 22.

The surfaces of both solid monolith sources 21 and 22 of FIG. 8 can be covered by contact mask 54 (FIG. 13), with their compositions corresponding to the first and second groups of layers of the periodic semiconductor structure being grown.

The contact mask 54 (FIG. 13) can be made of materials chemically inert to the semiconductor material of the respective source 52 and to the chemical carrier agent contained in the gas medium filling the vessel 1 (FIG. 1). Such materials can be $SiO_2$ and $Al_2O_3$.

The windows 55 (FIG. 13) of a specific shape and dimensions are made in the mask 54 covering the source 52 by means of the known photolithographic method.

Figure 14:
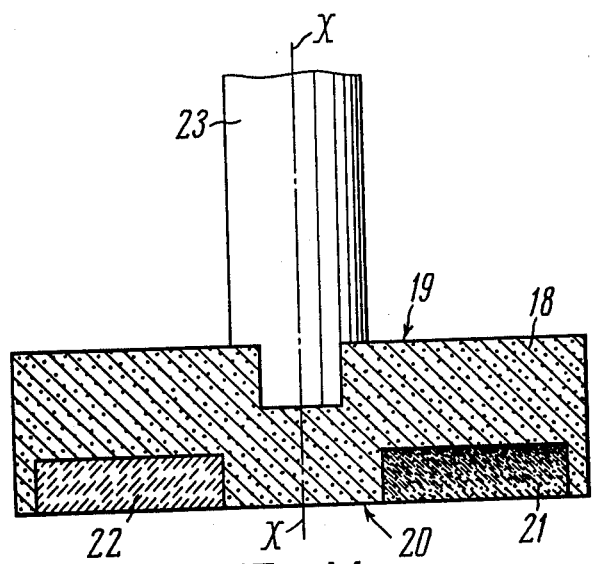
FIG. 14 shows a section taken along the axis of the reaction vessel of a disk featuring sources for epitaxial growing of semiconductor structures from a gas phase, according to the invention.

The hatching in FIG. 14 indicates that the material of the source 21 has a variable chemical composition, the gradient of the composition being directed perpendicular to the surface of the source 21.

The invention makes it possible to produce all sources 21 and 22 with a composition gradient directed parallel to the surface of the source. The value of the gradient is selected depending on the desirable modulation of the composition of the layers of the semiconductor periodic structure.

The device for epitaxial growing of semiconductor periodic structures from a gas phase, shown in FIG. 1, operates as follows.

The disks 7 and 18 are placed parallel and coaxial to each other by means of the adjusting screws 14 and 26.

The substrates 10 and the sources 21 and 22 are placed on the disks 7 and 18, respectively. The reaction vessel 1 is blown out by a gas mixture containing hydrogen or chemically inert gases in order to expel the air. The heaters 34 and 36 are switched on and the voltage is adjusted so that the disks 7 and 18 are heated to a sufficiently high temperature for the chemical reaction.

The temperature range from 700° to 1,000° C is suitable for the majority of semiconductor materials. In order to ensure the directed transfer of the substance from the sources 21 and 22 to the substrates 10, a temperature difference from 5° to 50° C should be provided between the disks 7 and 18, which produced the respective difference of the temperature between the sources 21 and 22, on the one, hand, and the substrates 10, on the other hand.

When the required temperature conditions of the substrates 10 and the sources 21 and 22 are set, an agent is added to the gas flow passing through the vessel 1, which ensures the chemical reaction.

The disks 7 and 18 are brought closer together by means of the drives 33 and 31 and a clearance is set between the operational surfaces 9 and 20 of the disks so that the distance between the surfaces of the substrate 10 and the source 22 located thereon is within a range of 50 microns to 5 millimeters.

Short distances (from 50 to 200 microns) are set in those instances, when a periodic structure of a very small period, e.g. 100 Å and less, is to be produced.

Then the disk 7 is made to rotate by switching the electric motor 17. During the rotation of the disk 7 the substrate 10 passes alternately under the sources 21 and 22 so that layers are deposited onto the substrate 10 alternately from one semiconductor material of the source 21 and from the other semiconductor material of the source 22.

As a result a semiconductor periodic structure 56 shown in FIG. 15 is produced.

The composition of the first group of layers 57 of the periodic structure 56 being grown corresponds to the composition of the source 21 (FIG. 1), whereas the composition of the other group of layers 58 (FIG. 15) corresponds to the composition of the source 22 (FIG. 1).

During crystallization of the precipitating layers 57 and 58 (FIG. 15) their crystallographic orientation reproduces the crystallographic orientation of the substrate 10 which should be made of a material exhibiting crystallographic parameters sufficiently close to those of the materials of the sources 21 and 22 (FIG. 1). This ensures epitaxial growth of a periodical structure on the monocrystalline substrate 10 which material is selected in conformity with the known criterions of crystal epitaxial growing.

After the disks 7 and 18 make the required number of revolutions determined by the specific number of alternating layers of the first and second groups in the periodic structure 56 (FIG. 15), the electric motor 17 (FIG. 1) is switched off, the disks 7 and 18 are separated to a large distance (e.g. 1 – 5 cm) by means of the drives 31 and 33 and the heaters 34 and 36 are turned off.

When the disks 7 and 18, as well as the sources 21 and 22 and the substrates 10 with the periodic structures grown thereupon are cooled to room temperature, the reaction vessel 1 is dehermetized by moving the flanges 3 and 4 apart and the substrates 10 with the periodic structures grown thereon are taken out.

New substrates 10 are then placed on the disk 7, the reaction vessel 1 is pressurized by closing the flanges 3 and 4 and the production cycle is performed in the same sequence as it has been described above.

The thickness of the layers 57 and 58 (FIG. 15) of each group constituting the periodic structure 56 and the sequence of their alternation within said structure 56 can be effectively controlled by varying the speed of the epitaxial growing through adjustment of the temperature of the disks 7 and 18 and their temperature difference, as well as by changing the speed of rotation of the disk 7 with respect to the disk 18, the number of the sources 21 and 22 of a different composition dimensions of the sources 21 and 22 and the sequence of their alternation on the disk 18. The thickness of each layer 57 and 58 within the periodic structure 56 is proportional to the velocity of the chemical substance transfer from the sources 21 and 22 (FIG. 1) to the substrate 10 and to the time the substrate 10 is kept close to the respective source 21 or 22, which is determined by the size of the source 21 and 22 and speed of rotation of the disk 7 with respect to the disk 18. In order to expand the range within which the relative speed of rotation of the disk 7 can be controlled, it is advisable that the disk 18 be rotated at the same time by means of the electric motor 29. In this case the relative rotation speed will be equal to the sum of the rotation speeds of the disks 7 and 18, if they rotate in opposite directions, and to their difference, if they rotate in one direction.

The number of different sources 21 and 22, their relative dimensions and the sequence of their arrangement on the disk 18 can be selected proceeding from the required composition and pattern of the periodic structure being grown.

The sources 21 and 22 can comprise semiconductor materials characterized by a different width of the forbidden zone, which is required, for example, for production of periodic structures of a "superlattice" type, as well as for production of laser elements with a waveguide periodic structure.

The sources 21 and 22 may also differ in the type of conduction of the semiconductor materials of which they are made.

Such sources 21 and 22 are recommended for the production of p-n periodic structures.

The sources 21 and 22 can also differ in the concentration of charge carriers, mobility of charge carriers and the lifetime of charge carriers, determined by a different concentration of the recombination active doping impurity in the sources 21 and 22.

The advantage of this invention consists in the easy programming of periodic variations of some characteristic semiconductor parameter or even several such parameters within the thickness of the periodic structure by means of an appropriate order of arrangement of the sources 21 and 22 over the disk 18.

The difference in velocities of the chemical transfer of different substances of the sources 21 and 22 can be compensated in order to obtain the layers 57 and 58 of uniform thickness within the periodic structure 56 (FIG. 15) by means of a proper selection of dimensions of the sources 21 and 22 (FIG. 1) so that the source 21 of the substance characterized by quick transfer is kept close to the substrate 10 for a shorter period of time than compared to the source 22 with a slowly transferred substance. The same results can be also attained by programmed variations of the rotation speed of the motors 17 and 29. The minimum number of the sources 21 and 22 is two, the least number of the substrates 10 is one. This technical solution, however, does not limit the number of the sources 21 and 22 and the number of the substrates 10, particularly if the diameters of the reaction vessel 1 and of the disks 7 and 18 are large enough. The greater number of the substrates 10 located on the disk 7 results in a greater capacity of the process of epitaxial growing of periodic structures. In this case the increase of the dimensions of the vessel 1 does not diminish control of the epitaxial growth process and does not affect production of the periodic structures 56 (FIG. 15) with a very small period, e.g. 100 Å.

This can be accounted for by the fact that, in order to switch from growing one layer 57 of the periodic structure 56 to another layer 58, it is only necessary to substitute one source 21 for another over the substrate 10 (FIG. 1) without changing the composition of the gas phase in the space of the vessel 1.

This constitutes a serious advantage of the disclosed method, because the accuracy of measuring batches of alternating substances fed to the substrate 10 from the different sources 21 and 22 during relative rotation of the disks 7 and 18 does not depend upon the volume of the reaction vessel 1 and the number of the substrates 10 situated on the disk 7 simultaneously.

In order to ensure repeatability of the thickness of the layers 57 and 58 (FIG. 15) in the periodic structures 56 on all the substrates 10 (FIG. 1) and on all parts of each substrate 10, the disks 7 and 18 are made of a heat-conducting material (graphite or glassy carbon) to produce uniform heating of the entire surface of the substrates 10. The special shape of the heaters 34 and 36, ensuring a flat temperature heating front, serves the same purpose. The heat shields 38 and 40 reduce thermal losses from the heaters 34 and 36 to the flanges 3 and 4 and contribute to a more uniform heating of the disks 7 and 18. The shields 38 and 40 are made of graphite, molybdenum, carbon coated quartz or other materials chemically inert to the gas medium inside the vessel 1.

Another embodiment of a device for epitaxial growing of semiconductor periodic structures from a gas phase is illustrated in FIG. 4.

This device is peculiar in that it has no adjustment screws 14 and 26 (FIG. 1) since the disks 7 and 18 are placed parallel to and coaxial to each other by means of locating the stem 46 (FIG. 4) attached the disk 18 coaxial with and inside the hollow shaft 43 attached to the disk 7.

The advantage of this embodiment consists in the simplicity of setting and maintaining the operational surfaces 9 and 20 parallel to each other and the disks 7 and 18 coaxial with each other.

One drive 33 for shifting the disk 18 is sufficient in the device of FIG. 4 to adjust the clearance between the surfaces of the substrate 10 and the source 22. The device of FIG. 4 operates similar to the device of FIG. 1 in all other respects.

Figure 5:
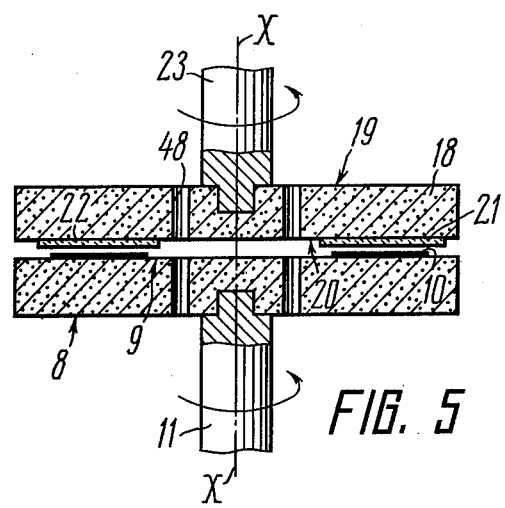
FIG. 5 shows a section taken along the axis of the reaction vessel of an embodiment of disks of the device for epitaxial growing of semiconductor periodic structures from a gas phase, as shown in FIG. 1, according to the invention.

FIG. 5 shows an embodiment of the disks 7 and 18 of a device for epitaxial growing of semiconductor periodic structures from a gas phase. It is characterized by the through opening 48 made in the central zone of the disks 7 and 18. In case such through openings 48 are absent, radial and opposite gas flows appear between the rotating disks 7 and 18: this flow is centrifugal at the surface of the faster revolving disk 7 and centripetal at the surface of the slower revolving disk 18. The flow rate increases as the rotation speed of disks 7 and 18 increases.

The interaction of these flows between each other results in objectionable gas vortexes distorting the diffusion flows, transferring substances from the sources 21 and 22 of different compositions to the substrates 10.

This may result in local nonuniformities in the composition of the growing epitaxial structures, which deteriorate the quality and repeatability of their parameters.

The through openings 48 made in the central zones of the disks 7 and 18 permit feeding a gas flow to the central zone of the clearance between the disks 7 and 18. Thus they eliminate the centripetal flow at the surface of the slower revolving disk 18 and away do with gas vortexes in the clearance between the disks 7 and 18. This permits higher uniformity of semiconductor periodic structures.

Another embodiment of the disks 7 and 18 also having the through openings 48 performing the above described functions is shown in FIG. 6.

The substrates 10 and the sources 21 and 22 are secured on the surfaces of respective disks 7 and 18 by means of the known methods.

One more embodiment of the disks 7 and 18 is shown as a section view in FIG. 7.

Since the depressions in the disk 18 adjoin one another, as the sources 21 and 22 also do, the process of crystallization goes on continuously while the substrate 10 passes subsequently under the sources 21 and 22, from the source 21 to the source 22.

The uninterrupted crystallization process and permanent velocity of crystallization contributes to the higher quality of the epitaxial structures being grown, because uncontrollable formation of flaws in the crystalline structure and adsorption of uncontrollable impurities at the moments when crystallization is stopped or slowed down are ruled out. FIG. 8 shows that the sources 21 and 22 in the form of truncated sectors adjoin one another tightly and ensure an uninterrupted process of crystallization, while the substrate 10 (FIG. 7) moves from the source 21 to the source 22.

In this case, as shown in FIG. 7, the size of the substrate 10 along the radius of the disk 7 should be such that the projection of the substrate 10 placed in the depression for the substrate in the disk 7 onto the disk 18 is within the limits of the depressions of each of the sources 21 and 22.

A third embodiment of a device for epitaxial growing of semiconductor periodic structures is shown in FIG. 9.

This embodiment is peculiar in that the disks 7 and 18 are in contact with the flat operational surfaces 9 and 20.

It is easy owing to such design to keep the disks 7 and 18 parallel and coaxial. The disks should be made of materials resisting abrasion, for example, of carbon glass. In all other respects this device operates similar to the devices shown in FIGS. 1 and 4.

An important advantage of such a device consists in the elimination of losses of the substance of the source 21 or 22, carried away by the flows from the clearance between the disks 7 and 18, as with the devices of FIGS. 1 and 4.

Uncontrolled mixing of the substances fed to the gas phase from the different sources 21 and 22 is substantially reduced, which contributes to a sharper concentration profile of the layer-to-layer variation in the composition of the periodic structure 56 (FIG. 15) and ensures production of periodic structures with a very small period, for example 100 A.

FIGS. 10 and 11 illustrate a top view and a section view of the disk 7 with the sources 51 and 52 placed thereon.

Here the source 51 is made of a powder semiconductor material and can contain a mixture of grains of two or several semiconductor materials.

The source 52 is made as a solid monocrystalline plate cut out of a monocrystalline ingot.

Production of a laser structure featuring periodic waveguide layers can serve as an example of a way such sources 51 and 52 can be used. Such structure comprises alternating layers of GaAs and GaAs$_{0.9}$P$_{0.1}$.

In order to epitaxially grow such a structure, the source 52 is made as a GaAs monocrystalline plate and the source 51 is composed of a powder mixture of GaAs and GaP grains taken in a molar ratio of 9:1, which is equivalent to the ratio of GaAs and GaP in a solid solution, conventionally designated as GaAs$_{0.9}$P$_{0.1}$.

The size of grains of the powder source 51 is selected at least twice as small as the distance between the surfaces of the source 51 and the respective substrate.

As can be seen in FIGS. 10 and 11, the place where each source 51 and 52 is located is restricted by the rims 53. These rims 53 are designed to ensure the direction and to maintain the permanent rate of the diffusion transfer of the substance from the source 51 and 52 to the respective substrate irrespective of the gradual exhaustion of the substance of the sources 51 and 52 in the process of the epitaxial growth and subsequent increase in the distance between the source 51 and 52 and the respective substrate.

The rims 53 are especially useful when the powder sources 51 are employed, because in this case the velocities of exhaustion of the solid sources 52 and the powder sources 51 differ substantially and, besides, the powder mixture should be kept from scattering on the rotating disk 7.

The use of the rims 53 is important while setting the clearance between the surfaces of the respective substrate and the sources 51 and 52 in excess of 500 microns, because it contributes to sharper layer-to-layer transitions in the composition of the periodic epitaxial structure.

Figure 12:
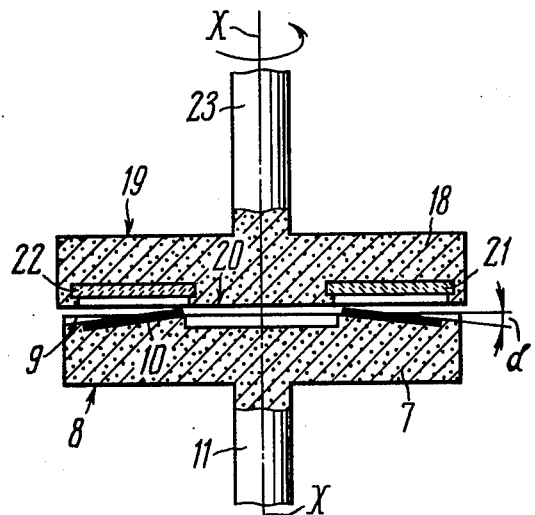
FIG. 12 shows a section taken along the axis of the reaction vessel of a disk of a device for epitaxial growing of semiconductor periodic structures from a gas phase, provided with depressions for substrates, made at an angle, according to the invention.

Referring to FIG. 12, the surfaces of the substrates 10 are tilted at an acute angle α with the operational surface 9 of the disk 7 and with the surface of the sources 21 and 22 parallel thereto. Such arrangement is advisable to obtain periodic structures with a variable period along the length of the substrate 10 in the radial direction, when the substrate 10 is located on the disk 7.

The angle α should be within a range from 0 to 10°, since any further increase of the angle can only lead to excessive losses of the substance from the clearance between the source 21 and 22 and the substrate 10 and to erosion of the periodic structure.

Referring to FIG. 16, the layers 59 and 60 of the periodic semiconductor structure being grown have variable thickness along the length of the substrate 10. The period equal to the sum of two adjoining layers 59 and 60 is, consequently, also variable. In this case the period is the largest in that part of the structure, which was located at the least distance from the sources 21 and 22 (FIG. 12) during the epitaxial growing of this structure.

When the angle α exceeds 10°, the clearance between the opposite parts of the substrate 10 and the sources 21 and 22 becomes too wide (over 5 mm), which results in unwanted mixing of the substances from the different sources 21 and 22 in the gas phase.

The period of the structure is the largest on the edge of the substrate 10, facing the center of the disk 7 during the epitaxial growth of the structure. The period is the least on the edge of the substrate 10, facing the periphery of the disk 7, that is on the edge farthest from the source 21 and 22. This effect is accounted for by the fact that the period of a periodic structure is proportional to the velocity of growing of the layers 59 and 60 (FIG. 16). The velocity of growing of the layers 59 and 60, in its turn, is proportional to the speed of the chemical transfer of the substance from the source 21 and 22 (FIG. 12) to the substrate 10, and the latter is proportional to the gradient of temperature between the sources 21 and 22 and the substrate 10 and, consequently, is inversely proportional to the distance between said part of the substrate 10 and the source 21 and 22, if the temperature is stable.

Semiconductor periodic structures with a variable period over the area appear promising for research purposes.

It is sufficient to investigate 1 – 2 samples with a variable period instead of tens of samples with different periods.

The advantage of the embodiment of the disk 7 shown in FIG. 12 is that the transfer of the substance to various portions of the surface of the substrate 10 is controlled under conditions of complete chemical uniformity of the surface of the source 21 and 22.

The velocity of the transfer of the substance from the source 52 (FIG. 13) to separate portions of the respective substrate 10 (FIG. 1) can also be controlled by means of the contact mask 54 covering the surface of the source 52 (FIG. 13) providing windows 55 of definite sizes.

The density of such windows on the surface of the source 52, that is the number of the windows 55 per unit area of the surface of the source 52, defines the speed of transfer of the substance from the source 52 to the closely locate portion of the respective substrate 10 (FIG. 1).

The speed of transfer of the substance of the source 52 (FIG. 13) to the respective substrate 10 (FIG. 1) is proportional to the free part of the surface of the source 52 (FIG. 13). That is why the epitaxial layer of the substance of the source 52 (FIG. 13) growing on the substrate 10 (FIG. 1) will be the thickest on the edge of the substrate 10 (FIG. 1), facing the center of the disk 7, where the density of the windows 55 (FIG. 13) is largest.

The principle of changing the free portion of the surface of the source 52 (FIG. 13) in the radial direction is determined depending on the required principle of variation of the thickness of the epitaxial layer from one edge of the substrate 10 (FIG. 1) to the other.

In its turn, the free portion of the surface is determined by the number and size of the windows 55 on a specific part of the surface of the source 52.

The shape of the windows 55 can be different, but preferably round, because such shape contributes to a higher durability of the contact mask 54 in the course of gradual exhaustion of the substance of the source 52 under said mask 54.

The mask 54 can be made of materials chemically inert to the semiconductor material of the source 52 and to the gas medium in vessel 1 (FIG. 1). Such coatings are, for example, $SiO_2$ and $Al_2O_3$ films. Application of the contact masks 54 (FIG. 13) and cutting the windows 55 therein are done by the known photolithographic methods widely used in electronics.

In order to ensure smooth changing of the thickness of the epitaxial layers 59 and 60 (FIG. 16) over the area of the epitaxial structure, the dimensions of the windows 55 (FIG. 13) and the spaces between are restricted as follows: the maximum transverse size of the windows 55 and the spaces between the edges of the adjoining windows 55 should substantially exceed (at least 3 - 6 times) the clearance between the surfaces of the respective substrate 10 (FIG. 1) and the source 52 (FIG. 13).

Such a source 52 is advantageous in that the transfer of the substance to various portions of the surface of the respective substrate 10 (FIG. 1) is controlled under conditions of a stable distance between the source 52 (FIG. 13) and the substrate 10 (FIG. 1) and, consequently, does not reduce the quality of the periodic structure.

One more embodiment of the source 21 is illustrated in FIG. 14, which makes it possible to vary the composition of the epitaxial layer in the process of its growth and modulate the periodic structure in the amplitude of the layer-to-layer composition variation. As the substance of the source 21 is expended, the composition of the substance transferred to the gas phase from its surface is constantly changing. The composition of the group of periodic structure layers, produced from the substance of the source 21 is, consequently, changing too.

Such a design of the source 21 permits control of the amplitude of the composition variations in the periodic structure in the process of its growing. This is especially important when growing "superlattice" periodic structures characterized by an extremely small period (of the order of 100 Å and less), where diffusion in the solid phase decreases the amplitude of the composition change in the first grown layers as compared to the layers grown last. The use of the source 21 with a definite composition gradient perpendicular to the surface of the source 21 permits compensation of the harmful effect of the diffusion erosion of the "superlattice" and, consequently, production of the "superlattice" of a better quality by means of a more uniform amplitude of the periodic variation of the composition within the thickness of the "superlattice".

The shape of the sources is not necessarily confined to those described in FIGS. 8, 11 and 13. The sources can have any shape conforming to the required alternation of even a part of the source surfaces in the rotation direction of the disk 18.

Referring to FIG. 17, the disk 18 carries two sources made of different semiconductor substances. The source of one of these substances is made as a geometric figure comprising a ring 61 and adjoing truncated sectors 62. The source of another semiconductor substance is shaped as a geometric figure comprising a circle 63 and adjoining truncated sectors 64 and 65.

FIG. 18 illustrates a section view of the disk 7 with the substrates 10. The radial dimension of each substrate 10 is sufficiently large for simultaneous growing of epitaxial layers of different compositions on its opposite ends, which correspond to the different sources.

As the disk 18 rotates, an epitaxial layer containing a periodic structure 66 grows on the central part of the surface of the substrate 10, a continuous portion 67 of the first semiconductor substance is formed on the peripheral part of the surface of the substrate 10. On the other part of the surface of the substrate 10, facing the center of the disk 7, a continuous portion 68 of another embodiment substance is formed.

As a result a complex three-dimensional epitaxial structure is produced, wherein alternating layers constituting the periodic structure 66 join the respective portions 67 and 68.

If sources are made of semiconductors of different types of conductivity, the structure produced in this way will comprise p-n junctions connected in parallel. Such a structure possesses an increased capacity proportional to the total area of p-n junctions and, consequently, to the number of layers in the periodic structure 66. Such a structure can be used, for example, to make nuclear particle detectors.

What is claimed is:

1. A device for epitaxial growing of semiconductor periodic structures from a gas phase, comprising:

a vertical tubular reaction vessel filled with gas and having an inlet and an outlet for said gas containing an agent for carrying out the chemical reaction;

a first disk located in said vessel and having an external surface and an operational surface, at least one substrate being placed near its periphery;

a first electric motor for rotating said first disk about the vertical axis of said vessel, which is located outside vessel and mechanically connected to said first disk;

at least two sources of substances forming the layers of said semiconductor periodic structure being grown;

a second disk located in said vessel near said first disk and coaxial thereto, said second disk having a diameter equal to the diameter of said first disk, said second disk having an external surface and an operational surface parallel to said operational surface of said first disk and holding at least two said substance sources adjoining each other and alternating in the direction of rotation of said second disk about said vertical axis of said vessel;

a second electric motor for rotating said second disk about said vertical axis of said vessel, which is located outside said vessel and mechanically connected to said second disk;

a drive for shifting a disk along said vertical axis of said vessel and located outside the vessel and mechanically connected to one of said disks;

a heater of a substrate located in said vessel near said external surface of said first disk;

a heater of sources located in said vessel near said external surface of said second disk;

both said heaters having a flat heating front and ensuring a temperature field with flat isothermal surfaces parallel to said operational surfaces of said disks;

at least one of said sources being a first semiconductor material with composition corresponding to the composition of the first group of layers of said periodic semiconductor structure being grown;

at least the second of said sources being made of a second semiconductor material with composition corresponding to the composition of the layers of said structure;

said disks being located with a clearance between the surfaces of said substrate and a respective source, selected from an interval from 50 microns to 5 mm.

2. A device as claimed in claim 1, wherein each said heater comprises a current conductive coil heated by electric current and protected by a sheath of a material inert to said gas medium inside said vessel.

3. A device as claimed in claim 1, comprising a first rod having a first end and a second end, said first end being rigidly secured in the center of said external surface of said first disk perpendicular to its said operational surface; first adjusting screws; said first rod extending out of said vessel and being tightened outside said vessel by said first adjusting screws; said second end of said first rod being kinematically connected to said electric motor for rotating said first disk; a second rod having a first end and a second end, said first end being rigidly secured in the center of said external surface of said second disk perpendicular to its said operational surface; second adjusting screws; said second rod extending out of said vessel and being tightened outside said vessel by said second adjusting screws; said second end of said second rod being kinematically connected to said electric motor for rotating said second disk; said drive for shifting a disk along the axis of said vessel being kinematically connected to said second end of said first rod.

4. A device as claimed in claim 3, comprising an additional drive for shifting a disk along the axis of said vessel and kinematically connected to said second end of said second rod.

5. A device as claimed in claim 1, comprising said first disk having a central opening; a hollow shaft having a first end and a second end, said first end being rigidly secured in said central opening of said first disk perpendicular to its said operational surface, said second end of said shift being kinematically connected outside said vessel to said electric motor for rotating said first disk; a stem with diameter less than the inner diameter of said hollow shaft and having a first end and a second end; said first end of said stem being connected to the center of said operational surface of said second disk; said stem being located inside said hollow shaft and centered therein so that said shaft and said stem are able to rotate with respect to each other, said stem extending out of said second end of said hollow shaft; said second end of said stem being kinematically connected to said electric motor for rotating said second disk and being connected to said drive for shifting the disk along the axis of said vessel.

6. A device as claimed in claim 5, wherein said first end of said stem is rigidly secured in said center of said operational surface of said second disk.

7. A device as claimed in claim 3, wherein said first and second disks have in the central zone near the location where said rods are fastened, openings with axes parallel to said vertical axis of said vessel, said openings letting the flow of said gas into the central zone in the clearance between said disks during their rotation.

8. A device as claimed in claim 5, wherein said first and second disks have in the central zone near the location where said hollow shaft and said stem are secured with respective openings having axes parallel to said axis of said vessel, said openings letting the flow of said gas into the central zone in the clearance between said disks during their rotation.

9. A device as claimed in claim 1, wherein said second disk has on said operational surface depressions along the periphery of said second disk, said depressions adjoining one another for holding said surfaces; the surface of each said source located in the respective depression being lower than said operational surface of said second disk by a distance from 50 microns to 5 mm.

10. A device as claimed in claim 1, wherein said first disk has on said operational surface depressions along the periphery of said first disk, said depressions adjoining one another for holding said substrates; the surface of each said substrate located in a respective depression being lower than said operational surface of said first disk by a distance from 50 to 500 microns.

11. A device as claimed in claim 9 wherein said first disk has on its operational surface depressions along the periphery of said first disk, said depressions adjoining one another for holding said substrates; the surface of each said substrate located in a respective said depression being lower than said operational surface of said first disk by a distance from 50 to 500 microns, the projection of said depressions of said first disk onto the surface of said second disk being less than said depressions of said second disk.

12. A device as claimed in claim 5, wherein said first disk has on said operational surface depressions along the periphery of said first disk, said depressions adjoining one another for holding said substrates; the surface of each said substrate located in a said respective depressions being lower than said operational surface of said first disk by a distance from 50 to 500 microns, said second disk being provided on said operational surface with depressions along the periphery of said second disk and adjoining one another for holding said sources; the surface of each said source located in the respective depression being lower than said operational surface of said second disk by a distance from 50 microns to 5 mm., the projection of said depressions of said first disk onto the surface of said second disk being less than said depressions of said second disk; said operational surfaces of said first and second disks being brought into contact, said stem being hinged to said center of said operational surface of said second disk.

13. A device as claimed in claim 1, wherein the location of each said source of substances on said operational surface of the second disk is bounded by a rim whose height over the surface of said source is selected from an interval from 0.5 to 5 mm.

14. A device as claimed in claim 1 wherein the surface plane of each said substance source is inclined with respect to the surface plane of a respective substrate at an angle less than 10°.

15. A device as claimed in claim 1, wherein at least one said substance source has on its surface a mask featuring windows with number, dimensions and arrangements selected so as to ensure the required velocity of the substance transfer from different parts of said source to said substrate.

16. A device as claimed in claim 1, wherein at least one said source of substances has a composition gradient directed perpendicular to the surface of said substance source.

* * * * *